United States Patent
Zuo et al.

(10) Patent No.: US 12,255,565 B2
(45) Date of Patent: Mar. 18, 2025

(54) ONLINE MONITORING AND COMPENSATION OF STATOR INTER-TURN SHORT CIRCUIT FAULT IN PERMANENT MAGNET SYNCHRONOUS MACHINES

(71) Applicant: MAGNA INTERNATIONAL INC., Aurora (CA)

(72) Inventors: Ying Zuo, Montreal (CA); Chunyan Lai, Montreal (CA); Lakshmi Varaha Iyer, Windsor (CA)

(73) Assignee: MAGNA POWERTRAIN GMBH & CO KG, Lannach (AT)

( * ) Notice: Subject to any disclaimer, the term of this patent is extended or adjusted under 35 U.S.C. 154(b) by 145 days.

(21) Appl. No.: 18/034,195

(22) PCT Filed: Oct. 26, 2021

(86) PCT No.: PCT/CA2021/051506
§ 371 (c)(1),
(2) Date: Apr. 27, 2023

(87) PCT Pub. No.: WO2022/087726
PCT Pub. Date: May 5, 2022

(65) Prior Publication Data
US 2023/0396204 A1 Dec. 7, 2023

Related U.S. Application Data

(60) Provisional application No. 63/106,583, filed on Oct. 28, 2020.

(51) Int. Cl.
H02P 29/024 (2016.01)
G01R 31/34 (2020.01)
(Continued)

(52) U.S. Cl.
CPC .......... *H02P 29/024* (2013.01); *G01R 31/346* (2013.01); *G01R 31/56* (2020.01); *H02P 21/13* (2013.01)

(58) Field of Classification Search
CPC ...... H02P 21/13; H02P 29/028; H02P 29/024; H02P 21/26; H02P 21/50; H02P 29/0241;
(Continued)

(56) References Cited

U.S. PATENT DOCUMENTS 10,088,516 B2   10/2018   Zhang et al.
2014/0159621 A1*  6/2014   Gu ........................ H02P 21/50
                                                         318/400.02

FOREIGN PATENT DOCUMENTS

EP      2741417 A2    6/2014
WO   2018111581 A1    6/2018

* cited by examiner

Primary Examiner — Said Bouziane
(74) Attorney, Agent, or Firm — Dickinson Wright PLLC

(57) ABSTRACT

A method and system for online monitoring and compensation of inter-turn short circuit faults (ISF) in windings of electric machines, such as permanent magnet synchronous motors is provided. A method for characterizing an ISF in a winding of an electric machine comprises: measuring phase voltages and currents; calculating sequence components of the electric machine based on the phase voltages and currents; determining a ratio between a percentage of shorted turns in the winding and a fault loop resistance based on the sequence components of the electric machine; and estimating characteristics of the inter-turn short circuit fault using an unscented Kalman filter. The characteristics include at least one of: a fault current, the percentage of shorted turns, or the fault loop resistance. A method for compensation an ISF in a winding of an electric machine comprises compensating the fault current based on the compensation current estimated from an unscented Kalman filter.

20 Claims, 7 Drawing Sheets

(51) Int. Cl.
*G01R 31/56* (2020.01)
*H02P 21/13* (2006.01)

(58) Field of Classification Search
CPC . H02P 29/0243; H02P 29/032; G01R 31/346; G01R 31/56; H02H 7/0838
See application file for complete search history.

ONLINE MONITORING AND COMPENSATION OF STATOR INTER-TURN SHORT CIRCUIT FAULT IN PERMANENT MAGNET SYNCHRONOUS MACHINES

CROSS-REFERENCE TO RELATED APPLICATIONS

This U.S. National Stage Patent Application claims the benefit of PCT International Patent Application Serial No. PCT/CA2021/051506 filed Oct. 26, 2021 entitled "ONLINE MONITORING AND COMPENSATION OF STATOR INTER-TURN SHORT CIRCUIT FAULT IN PERMANENT MAGNET SYNCHRONOUS MACHINES" which claims the benefit of and priority to U.S. Provisional Patent Application Ser. No. 63/106,583, filed Oct. 28, 2020, titled "Online Monitoring Of Stator Inter-Turn Short Circuit Fault In Permanent Magnet Synchronous Machines," the entire disclosure of which is hereby incorporated by reference.

FIELD

The present disclosure relates generally to detecting and characterizing inter-turn short circuit faults in windings of electric machines.

BACKGROUND

Permanent magnet synchronous machines (PMSMs) are widely used in electric vehicle (EV) applications due to their high efficiency, high power density, light weight and compactness. Safety and reliability are of important considerations in electric machines. One type of fault known to affect PMSMs is the inter-turn short circuit fault (ISF). The ISF can cause a high value of current in the shorted winding branch, in turn heating up the local area that eventually leads to the propagation of fault in the entire winding that can even stall the entire system if adequate actions are not taken. Therefore, there has been an increasing attention to the ISF monitoring in PMSMs. Previous studies provide various methods to detect the ISF in PMSMs. Based on the applied techniques, ISF diagnosis methods can be classified into the model-based, signal-based and artificial intelligence (AI)-based approaches.

In model-based methods, a state observer is usually designed to identify the fault parameter of the motor based on the unbalanced three phase variable model of faulty PMSMs. For example, a flux linkage observer may be employed to obtain the short circuit ratio. An extended state observer may be used to monitor the unbalanced back electromotive force (EMF) in the faulty machine. However, known model-based methods can fail to adequately consider resistance in the short circuit path and/or short circuit current, which is essential to avoid further damage to the faulted machine.

Signal analysis methods, such as motor current signature analysis (MCSA) may be used to identify an ISF by obtaining specific current harmonics via fast Fourier Transform (FFT). This method is typically non-invasive and cost-effective because it only uses stator current to detect the ISF in the machine. Therefore, many signal analysis methods are applied in the ISF detection algorithms, such as wavelet analysis, short-time Fourier transform (STFT) and Hilbert-Huang Transform. Conventional signal-based fault-detection methods are generally limited to distinguishing ISF from other types of faults, which can also produce similar effects in the currents spectra. Specifically, the effects of inherent asymmetry and voltage imbalance are mostly neglected, when analyzing the stator current harmonics. Therefore, the current harmonic analysis is not typically reliable enough to detect ISF severity.

AI-based techniques have been applied for fault diagnosis using artificial neural network (ANN), fuzzy logic system, and expert systems. Such AI-based methods can not only detect and estimate the fault severity, but also locate the fault position. However, AI-based methods are computationally expensive and they can be difficult to implement in real-world applications.

In summary, the existing ISF detection methods have performance limitations, which can include: 1) unreliable indicators of fault severity; 2) inability to distinguish ISF from other faults; and 3) difficulty to apply in practice.

Inter-turn short circuit faults (ISF) account for 30% to 40% of faults in permanent magnet synchronous machines (PMSMs). ISF can cause a high value of current in the shorted winding branch, in turn heating up the local area that eventually leads to the propagation of fault in the entire winding and can even stall the entire system if adequate actions are not taken immediately. Therefore, a reliable online ISF monitoring method would be advantageous to provide information about this fault in real-time and to prevent resulting damages.

SUMMARY

In accordance with an aspect of the disclosure, a method for characterizing an inter-turn short circuit fault in a winding of an electric machine comprises: determining phase voltages and phase currents of the electric machine; calculating sequence components of the electric machine based on the phase voltages and the phase currents; determining, based on the sequence components of the electric machine, a ratio between a percentage of shorted turns in the winding and a fault loop resistance; and estimating, using an unscented Kalman filter, at least one characteristic of the inter-turn short circuit fault, the at least one characteristic including at least one of: a fault current in the inter-turn short circuit fault, the percentage of shorted turns, and the fault loop resistance.

In accordance with an aspect of the disclosure, a method for compensating an inter-turn short circuit fault in an electric machine is provided. The method comprises: determining a plurality of phase voltages based on a current command; applying, by an inverter, the plurality of phase voltages to corresponding windings of a plurality of windings of the electric machine, one of the windings having the inter-turn short circuit fault; determining phase currents in each of the plurality of windings; calculating sequence components of the electric machine based on the plurality of phase voltages and the phase currents; determining a change in fault factor based on the sequence components; determining if the change in fault factor is greater than a fault threshold value; estimating, in response to determining the change in fault factor is greater than the fault threshold value, using an unscented Kalman filter, at least one characteristic of the inter-turn short circuit fault, the at least one characteristic including a fault current in the inter-turn short circuit fault; determining a compensation current based on the fault current in the inter-turn short circuit fault; and adjusting the current command based on the compensation current to compensate the fault current.

In accordance with an aspect of the disclosure, a system for compensating an inter-turn short circuit fault in an electric machine having a plurality of windings is provided.

The system comprises: an inverter configured to apply phase voltages to corresponding windings of the plurality of windings, one of the plurality of windings having the inter-turn short circuit fault; and a controller configured to: determine the phase voltages based on a current command; determine phase currents in each of the plurality of windings; calculate sequence components of the electric machine based on the phase voltages and the phase currents; calculate a change in fault factor based on the sequence components; determine if the change in fault factor is greater than a fault threshold value; estimate, in response to determining the change in fault factor is greater than the fault threshold value, using an unscented Kalman filter, at least one characteristic of the inter-turn short circuit fault, the at least one characteristic including a fault current in the inter-turn short circuit fault; determine a compensation current based on the fault current in the inter-turn short circuit fault; and adjust the current command based on the compensation current to compensate the fault current.

BRIEF DESCRIPTION OF THE DRAWINGS

Further details, features and advantages of designs of the invention result from the following description of embodiment examples in reference to the associated drawings.

DETAILED DESCRIPTION

Referring to the Figures, wherein like numerals indicate corresponding parts throughout the several views, a system and method for characterizing an inter-turn short circuit fault in an electric machine is disclosed. More specifically, this disclosure describes the method in by way of an example method for online monitoring of inter-turn short circuits of Permanent Magnet Synchronous Motors (PMSMs). The term "Online" may refer to an electric machine that is in situ, or which is connected to electrical and/or mechanical hardware of its operating environment. For example, the method and system of the present disclosure may be used to diagnose faults in a PMSM that is installed within an electric vehicle (EV). In some cases, the method may be performed as part of a periodic maintenance or system check. For example, an electric vehicle may perform the method of the present disclosure as part of a startup check to begin a driving session. In some embodiments, the method may be performed using hardware components, such as a motor drive and controller, that are already in place for operating the electric machine.

Figure 1:
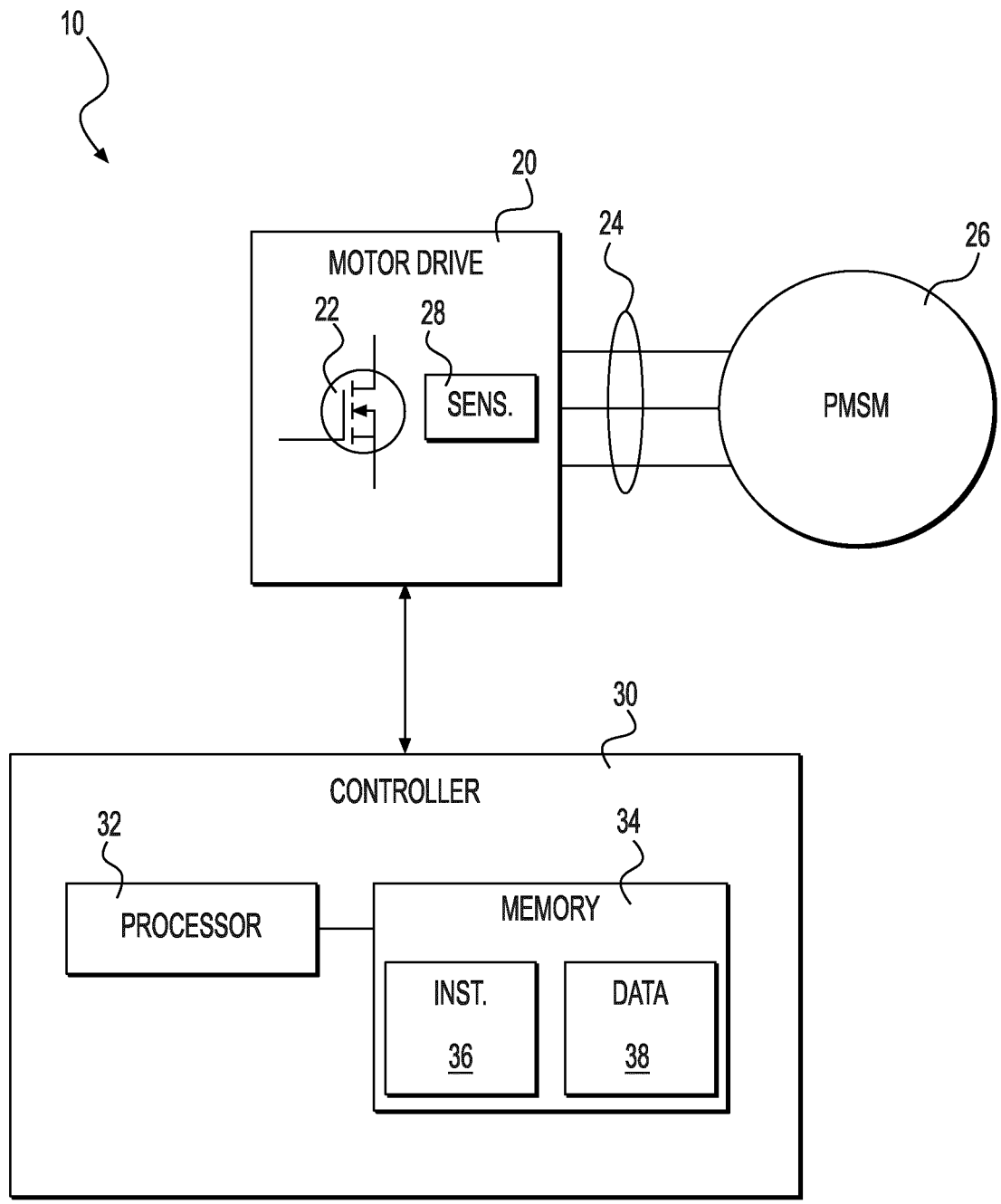
FIG. 1 shows a block diagram of system in accordance with an aspect of the present disclosure.

FIG. 1 shows a block diagram of system 10 in accordance with an aspect of the present disclosure. The system 10 includes a motor drive 20 having one or more switching devices 22, such as field effect transistors (FETs) configured to generate an AC power upon a set of motor leads 24 and/or to rectify AC power from the motor leads 24. The motor leads 24 transmit electrical power between the motor drive 20 and an electric machine 26. The electric machine 26 is a permanent magnet synchronous machine (PMSM) in the example system 10. However, the system 10 may be used with other types of electric machines such as wound field machines, inductance machines, and/or reluctance machines. The electric machine 26 is shown as a 3-phase machine, however, the electric machine may have any number of phases. For example, the electric machine 26 may be a single-phase machine, a 3-phase machine, or a higher-order multiphase machine. The electric machine 26 may be used as a motor, a generator, or as a motor/generator that functions as both a motor and a generator. The motor drive 20 also includes sensors 28, such as voltage and current sensors which may be configured to measure voltages upon or between the motor leads 24 and/or currents on the motor leads 24.

The system 10 of FIG. 1 also includes a controller 30 in functional communication with the motor drive 20. The controller 30 may be configured to control operation of the motor drive 20 and/or to monitor parameters measured by the sensors 28. The controller 30 includes a processor 32 coupled to a storage memory 34. The storage memory 34 stores instructions, such as program code for execution by the processor 32. The storage memory 34 also includes data storage 38 for holding data to be used by the processor 32. The data storage 38 may record, for example, values of the parameters measured by the sensors 28 and/or the outcome of functions calculated by the processor 32.

Figure 2:
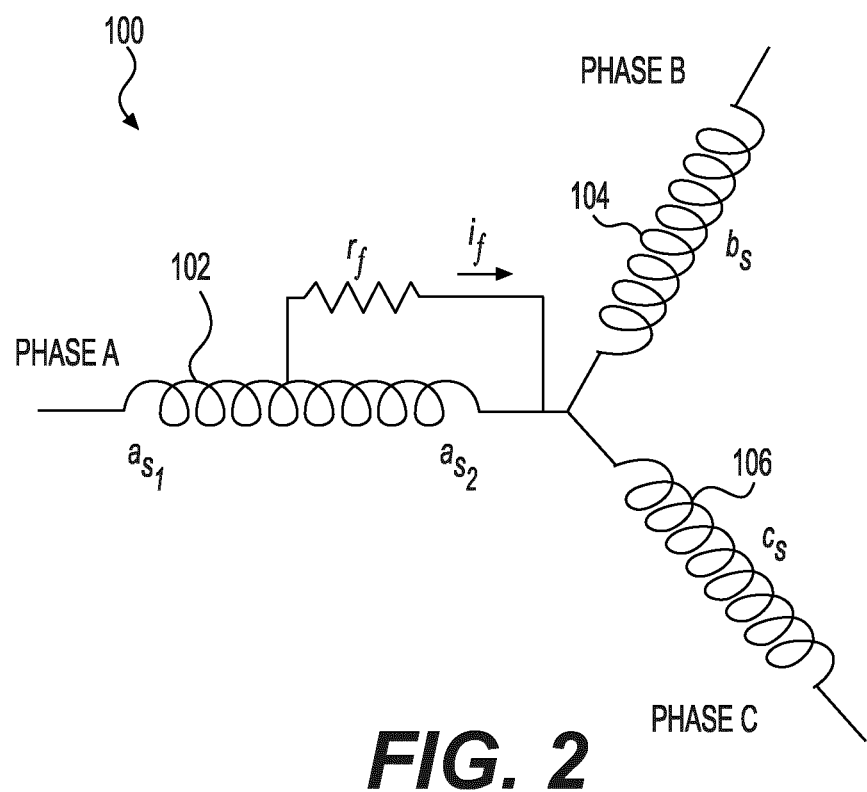
FIG. 2 shows a schematic diagram of stator windings with an inter-turn short circuit fault in accordance with the present disclosure.

FIG. 2 shows a schematic diagram 100 of stator windings 102, 104, 106 with an inter-turn short circuit fault in accordance with the present disclosure. The stator windings 102, 104, 106 may be located within the electric machine 26. Specifically, the stator windings 102, 104, 106 include a phase-A winding 102 having an inter-turn short circuit fault.

Figure 3:
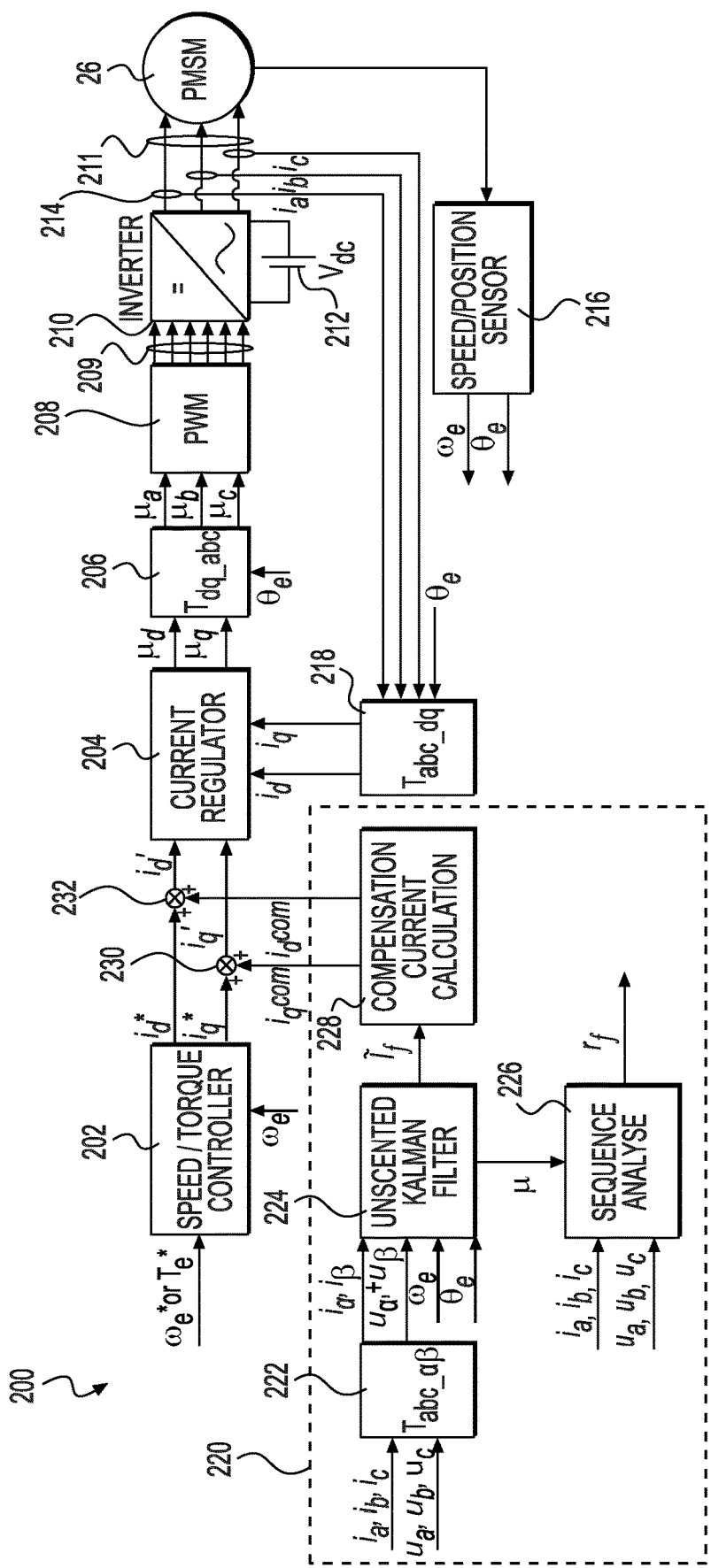
FIG. 3 is a block diagram of a drive system for characterizing and compensating an inter-turn short circuit fault (ISF) in an electric machine, in accordance with aspects of the present disclosure.

FIG. 3 shows a block diagram of a drive system 200 for characterizing and compensating an inter-turn short circuit fault (ISF) in an electric machine 26. The drive system 200 includes a speed/torque controller 202 configured to generate a current command $i_{d,q}*$ to satisfy one of a speed command $\omega_e*$ or a torque command $T_e*$. In some embodiments, and as shown in FIG. 3, the current command $i_{d,q}*$ includes a d-axis current command $i_d*$ and a q-axis current command $i_q*$.

The drive system 200 also includes a current regulator 204 configured to generate d-axis and q-axis voltage commands $u_d$, $u_q$ to adjust a motor current $i_{a,b,c}$ supplied to electric machine 26 based on the current command $i_{d,q}*$. The current regulator 204 takes, as inputs, the d-axis current command $i_d*$, the q-axis current command $i_q*$, and d-axis and q-axis motor currents $i_d$, $i_q$, representing the motor current $i_{a,b,c}$ supplied to electric machine 26. The drive system 200 also includes a first transform block 206 configured to generate phase voltages $u_a$, $u_b$, $u_c$ based on the d-axis and q-axis voltage commands $u_d$, $u_q$. The phase voltages $u_a$, $u_b$, $u_c$.

The drive system 200 also includes a pulse-width-modulator (PWM) 208 configured to generate PWM signals 209 corresponding to each of the phase voltages $u_a$, $u_b$, $u_c$. The drive system 200 also includes an inverter 210 configured to switch DC power from a DC source 212 based on the PWM signals 209 to cause motor leads 211 connected to the electric machine 26 to be energized with the corresponding phase voltages $u_a$, $u_b$, $u_c$.

The drive system 200 also includes one or more current sensors 214 configured to measure phase currents $i_a$, $i_b$, $i_c$ in each of the corresponding motor leads 211. The drive system 200 also includes a speed and position sensor 216 functionally coupled to electric machine 26 and configured to measure a motor speed $\omega_e$ and a motor position $\theta_e$. The drive system 200 also includes a second transform block 218 configured compute the d-axis and q-axis motor currents $i_d$, $i_q$ is based on the phase currents $i_a$, $i_b$, $i_c$ and the motor position $\theta_e$.

The drive system 200 of FIG. 3 also includes an ISF compensator 220 configured to compensate for an inter-turn short circuit fault (ISF) in one of the windings 102, 104, 106 of the electric machine 26. One of the windings 102, 104, 106 having an ISF may be called a faulted winding. The ISF compensator 220 includes a third transform block 222 configured to calculate αβ-domain current signals $i_\alpha$, $i_\beta$ based on the phase currents $i_a$, $i_b$, $i_c$ and to calculate αβ-domain voltage signals $u_\alpha$, $u_\beta$ based on the phase voltages $u_a$, $u_b$, $u_c$, applied to the electric machine 26. The drive system 200 of FIG. 3 also includes an Unscented Kalman Filter (UKF) block 224 that is configured to estimate fault parameters $\mu$, $\tilde{I}_f$ including a ratio of short circuit turns to total turns ($\mu$) in a faulted winding of the electric machine 26 and an estimated fault current $\tilde{I}_f$ in the faulted winding of the electric machine 26. The UKF block 224 may take, as inputs, the αβ-domain current signals $i_\alpha$, $i_\beta$ and the αβ-domain voltage signals $u_\alpha$, $u_\beta$ from the third transform block 222. The UKF block 224 may also take, as inputs, signals representing the motor speed $\omega_e$ and the motor position $\theta_e$ from the speed and position sensor 216.

The ISF compensator 220 of the drive system 200 also includes a sequence analyzer block 226 configured to determine an estimated fault resistance $r_f$ of the short circuit turns in the faulted winding of the electric machine 26. The ISF compensator 220 of the drive system 200 also includes a compensation current calculator block 228 configured to compute a q-axis compensation current $i_q^{com}$ and a d-axis compensation current $i_d^{com}$ to compensate for effects of the faulted winding of the electric machine 26.

The ISF compensator 220 of the drive system 200 also includes a q-axis current adder 230 configured to add the q-axis current command $i_q*$ and the q-axis compensation current $i_q^{com}$ to calculate a modified q-axis current command $i_q'$. The ISF compensator 220 of the drive system 200 also includes a d-axis current adder 232 configured to add the 2-axis current command $i_d*$ and the d-axis compensation current $i_d^{com}$ to calculate a modified d-axis current command $i_d'$. The current regulator 204 may take, as inputs, these modified current commands $i_d'$, $i_q'$ for controlling the current supplied to the electric machine 26.

In accordance with an aspect of the present disclosure, a method for characterizing an inter-turn short circuit fault (ISF) in an electric machine is provided. The proposed method includes detecting characteristics of the electric machine, which may be performed while the electric machine is operating, determining from those characteristics whether an inter-turn short circuit fault is present on one or more of windings of the electric machine, and determining severity of characteristics associated with an ISF, which can be used as indicators of the health of the electric machine.

According to an aspect of the disclosure, a method 300 for characterizing an inter-turn short circuit fault in a winding of an electric machine is provided. The method 300 may be summarized in Algorithm I, listed below.

Algorithm I: ISF detection algorithm

1. Measure stator voltages and currents;
2. Calculate sequence components and ΔFF using (9);
3. If ΔFF > fault threshold for $\frac{1}{3}\mu \tilde{I}_f$, go to 4;

Else Go to 2.
4. Estimate fault parameters ($\tilde{I}_f$, $r_f$ and $\mu$) by using UKF;
5. If $|\tilde{I}_f|$ < failure threshold for $|\tilde{I}_f|$, compensating the fault current based on the compensation current estimated from UKF and go to 2;
   Else Stop machine and perform maintenance.

Figure 4:
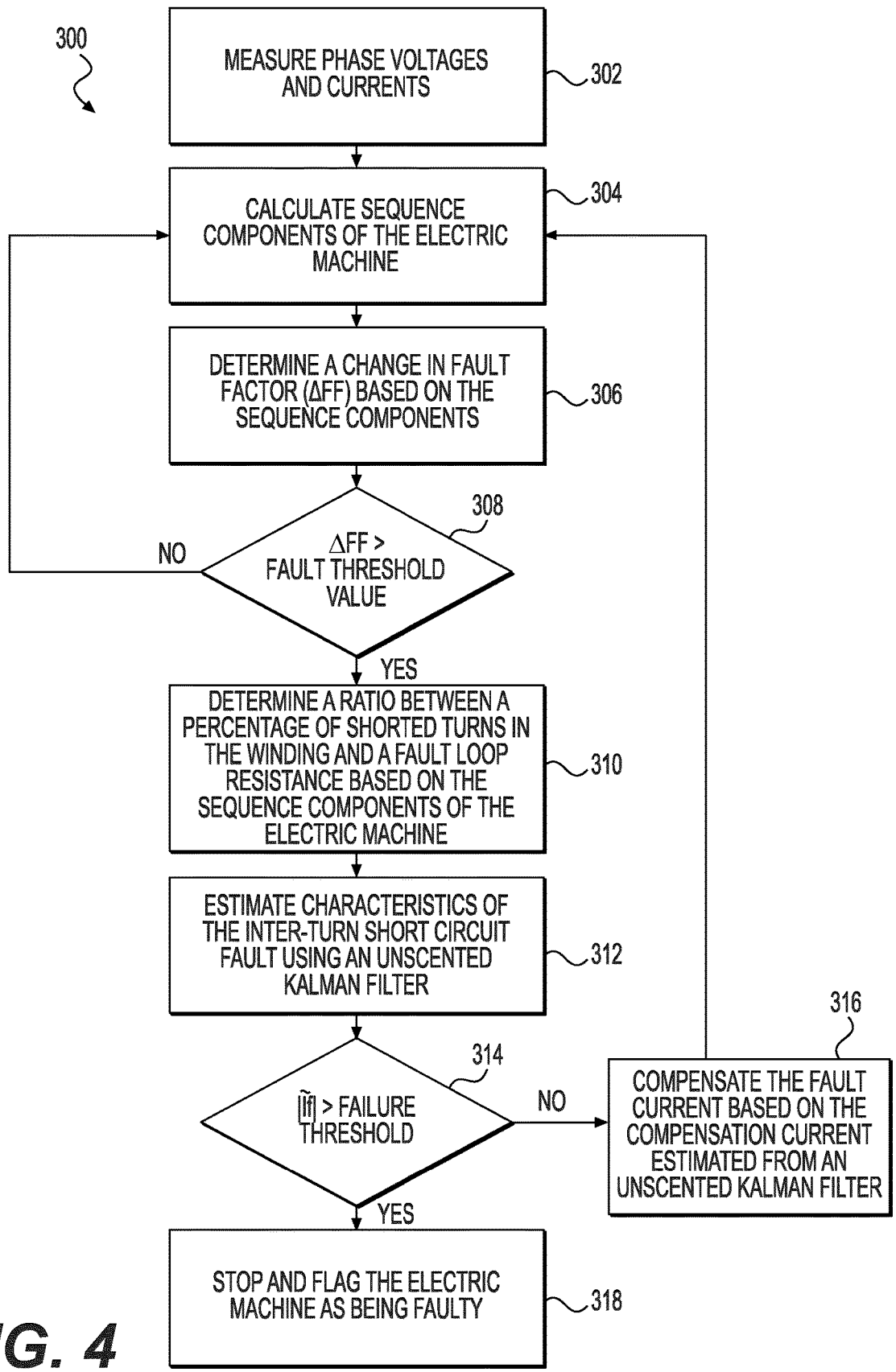
FIG. 4 is a flow chart listing steps in a method for characterizing and compensating an ISF in an electric machine in accordance with aspects of the present disclosure.

The method 300 for characterizing an inter-turn short circuit fault in a winding of an electric machine is provided and is also shown in the flow chart of FIG. 4. All or parts of the method 300 may be performed by the drive system 200.

The method 300 includes measuring phase voltages and currents at step 302. The phase voltages and currents may be measured, for example, by sensors within a motor drive configured to supply AC power to the electric machine.

The method 300 also includes calculating sequence components of the electric machine at step 304. The sequence components may include, for example, a positive sequence impedance $Z_{pp}$. The positive sequence impedance $Z_{pp}$ may be calculated as $Z_{pp}=R+j\omega_e L$, where R is phase resistance, L is phase inductance and $\omega_e$ is the electrical angular velocity of the rotor. Step 304 may be performed by the processor 32 executing instructions to implement the UKF block 224 and/or the sequence analyzer block 226.

The method 300 also includes determining a change in fault factor (ΔFF) based on the sequence components at step 306. In some embodiments, step 306 may include calculating the fault factor FF, which may be calculated using the equation $$FF = \tilde{I}_{sp} - \frac{\tilde{V}_{sp}}{Z_{pp}},$$

where $\tilde{I}_{sp}$ is a positive sequence current, $\tilde{V}_{sp}$ is a positive sequence voltage and $Z_{pp}$ is a positive sequence impedance. Step 306 may then monitor a change in the fault factor FF (i.e. ΔFF) to detect ISF. If there is no ISF, ΔFF will be zero even with voltage imbalance and inherent asymmetry of the motor. If there is ISF, ΔFF will not be zero anymore.

Step 306 may be performed by the processor 32 executing instructions to determine the change in fault factor ΔFF or to otherwise determine the change in fault factor ΔFF. For example, the change in fault factor ΔFF may be determined by tracking the fault factor FF and calculating the change as ΔFF=FF(k)–FF(k–1). FF(k) is the value of the fault factor FF at a current time instant and FF(k–1) is the value of FF at a previous time. More complex tracking may be involved to determine the change in fault factor ΔFF based on values of value of the fault factor FF over some extended period of time.

The change in fault factor ΔFF may be represented as $$\Delta FF = FF_h - FF_f = -\frac{Z_{pf}}{Z_{pp}} \tilde{I}_f = \frac{1}{3}\mu \tilde{I}_f,$$

where ΔFF is the change in fault factor, $FF_h$ is a fault factor of a healthy winding, $FF_f$ is a fault factor of a faulty winding, $Z_{pf}$ is a sequence impedance of the faulty winding for a positive sequence current, $Z_{pp}$ is a sequence impedance for a positive sequence current, μ is a ratio of short circuit turns to total turns in the one of the windings having the inter-turn short circuit fault, and $\tilde{I}_f$ is the fault current. It can be seen from the equation $$\Delta FF = FF_h - FF_f = -\frac{Z_{pf}}{Z_{pp}} \tilde{I}_f = \frac{1}{3}\mu \tilde{I}_f$$

that the change in fault factor (ΔFF) is only related to ISF and not affected by voltage imbalance and inherent asymmetry of the electric machine. When the electric machine does not have ISF, the fault factor (i.e. $FF_h$) may be determined using equation (a):

$$FF_h = -\frac{Z_{pn}}{Z_{pp}} \tilde{I}_{sn} - \frac{\tilde{E}_{sp}}{Z_{pp}} \quad (a)$$

When the electric machine has ISF, the fault factor (i.e. $FF_f$) may be represented using equation (b):

$$FF_f = -\frac{Z_{pn}}{Z_{pp}} \tilde{I}_{sn} - \frac{Z_{pf}}{Z_{pp}} \tilde{I}_f - \frac{\tilde{E}_{sp}}{Z_{pp}} \quad (b)$$

The change in FF (ΔFF) when ISF happens, may be represented using equation (c):

$$\Delta FF = FF_h - FF_f = -\frac{Z_{pf}}{Z_{pp}} \tilde{I}_f = \frac{1}{3}\mu \tilde{I}_f \quad (c)$$

The fault factors $FF_h$, $FF_f$ may be calculated using $$\tilde{I}_{sp} - \frac{\tilde{V}_{sp}}{Z_{pp}}.$$

Equations (a) and (b), above, may be provided just for the derivation of equation (c). If the electric machine has no ISF, ΔFF will be zero even with voltage imbalance and inherent asymmetry of the electric machine. If there is ISF, ΔFF will have a non-zero value and ΔFF will increase as the fault severity increases. Hence, tracking ΔFF can detect ISF even under voltage imbalance and inherent asymmetry of the electric machine.

The method 300 also includes determining if the change in fault factor is greater than a fault threshold value at step 308. Step 304 may be performed by the processor 32 executing instructions to perform the comparison. The fault threshold value may be predetermined. Additionally or alternatively, the fault threshold value may be adjusted during system operation.

The method 300 also includes determining a ratio between a percentage of shorted turns in the winding and a fault loop resistance $r_f$ based on the sequence components of the electric machine at step 310. The percentage of shorted turns in the winding may be directly related to the ratio of short circuit turns to total turns μ in the winding having ISF. In some embodiments, Step 310 may include using the equation:

$$r_f = \frac{\mu \tilde{V}_{sp}}{\tilde{I}_f} = \frac{\mu^2 \tilde{V}_{sp}}{3\Delta FF} = k\mu^2, \text{ where } k = \frac{\tilde{V}_{sp}}{3\Delta FF}$$

Step 310 may be performed by the processor 32 executing instructions determine the ratio between the percentage of shorted turns in the winding (or the ratio of short circuit turns to total turns (μ) in the winding) and the fault loop resistance $r_f$. Step 310 may be performed in response to determining the change in fault factor is greater than the fault threshold value at step 308.

The method 300 also includes estimating characteristics of the inter-turn short circuit fault using an unscented Kalman filter at step 312. The characteristics of the ISF may include one or more of: a fault current ($\tilde{I}_f$), a fault resistance ($r_f$) and/or a ratio of shorted turns to total turns in the winding (μ). In some embodiments, Step 312 may include the processor 32 executing instructions to implement the Unscented Kalman Filter (UKF) block 224 to estimate the ratio of short circuit turns to total turns μ and/or the fault current $\tilde{I}_r$ in a faulted winding of the electric machine. Step 312 may include the processor 32 executing instructions to implement the sequence analyzer block 226 to determine the fault resistance $r_f$ of the short circuit turns in the faulted winding of the electric machine. Step 312 may be performed in response to determining the change in fault factor is greater than the fault threshold value at step 308.

The method 300 also includes determining if an absolute value of the fault current ($|\tilde{I}_f|$) is less than a failure threshold at step 314. The failure threshold may also be called a "failure threshold for $|\tilde{I}_f|$." Step 314 may include the processor 32 executing instructions to compute the absolute value of the fault current ($|\tilde{I}_f|$) and to compare that absolute value of the fault current ($|\tilde{I}_f|$) to the failure threshold. The failure threshold may be predetermined. Additionally or alternatively, the failure threshold may be adjusted during system operation.

The method 300 also includes compensating the fault current based on the $\tilde{I}_f$ estimated from UKF in response to determining the absolute value of the fault current is less than the failure threshold at step 316. Step 316 may be implemented using the ISF compensator 220. For example, step 316 may include the processor 32 implementing some or all of the ISF compensator 220.

The method 300 also includes stopping the electric machine and/or flagging the electric machine as being faulty in response to determining the absolute value of the fault current ($|\tilde{I}_f|$) is not less than the failure threshold at step 318. Flagging the electric machine as being faulty may designate the electric machine as requiring maintenance. For example, the processor 32 may generate and store a diagnostic trouble code (DTC) to designate the electric machine as requiring maintenance. Alternatively or additionally, the processor 32 may transmit one or more messages or otherwise enunciate the condition of the electric machine and/or flagging the electric machine as being faulty. For example, the processor 32 may cause a warning light to be illuminated and/or a warning message to be displayed on a user interface.

A mathematical model for PMSMs is presented to understand the behavior of the machine with an inter-turn fault. Then, a relationship between the percentage of shorted turns and fault loop resistance is derived by analyzing the sequence components. An unscented Kalman filter (UKF) is employed to estimate the fault current, the percentage of shorted turns and fault loop resistance in the PMSM. The effect of voltage imbalance and inherent asymmetry are considered and canceled-out in the proposed method during a fault-severity estimation.

Stator faults form about 30% of all the faults in industrial motors. In accordance with an aspect of the present disclosure, an unscented Kalman filter (UKF)-based method to estimate the severity level of stator inter-turn short circuit fault in permanent magnet synchronous machines (PMSMs) is presented.

A mathematical model for PMSMs is described. The mathematical model may aid in describing the behavior of the machine with inter-turn faults, where the effects of machine asymmetry and voltage imbalance are both considered. The UKF is then employed to estimate the fault variables in the PMSM, such as short circuit current, the percentage of shorted turns and fault loop resistance, to monitor the fault severity. In order to verify the proposed method, a finite element analysis (FEA) based system simulation is carried out, where various fault severity levels under different load and voltage imbalance conditions are considered.

PMSM Modeling with ISF Fault

When ISF happens, the effective number of turns decreases in the motor winding. This phenomenon causes asymmetry in the machine's armature current and degrades machine performance. The ISF is usually modeled by an extra fault resistor $R_f$, which is shown in FIG. 2 under the phase A winding. Here, we assume the healthy winding in phase A as winding $a_{s1}$ and the faulty part as winding $a_{s2}$. Assume that N is the number of turns in phase A and the number of short circuit turns is $N_s$, $\mu=N_s/N$ represents a ratio of short circuit turns to total turns of the winding.

ISF Model in abc-Coordinates

The motor model under faulty condition can be written as in equation (1), below, in the abc frame while the faulty components induced in the motor phases are included.

$$\begin{bmatrix} V_a \\ V_b \\ V_c \\ 0 \end{bmatrix} = \begin{bmatrix} R & 0 & 0 & -R_{a2} \\ 0 & R & 0 & 0 \\ 0 & 0 & R & 0 \\ -R_{a2} & 0 & 0 & R_{a2}+r_f \end{bmatrix} \begin{bmatrix} i_a \\ i_b \\ i_c \\ i_f \end{bmatrix} + \begin{bmatrix} e_a \\ e_b \\ e_c \\ -e_f \end{bmatrix} + \\ \begin{bmatrix} L & M & M & -(L_{a2}+M_{a1a2}) \\ M & L & M & -M_{a2b} \\ M & M & L & -M_{a2c} \\ -(L_{a2}+M_{a1a2}) & -M_{a2b} & -M_{a2c} & L_{a2} \end{bmatrix} \frac{d}{dt}\begin{bmatrix} i_a \\ i_b \\ i_c \\ i_f \end{bmatrix} \quad (1)$$

$$e_f = \mu e_a \quad (2)$$

$$R_{a2} = (1-\mu)R$$

$$L_{a2} = (1-\mu)^2 L$$

$$M_{a1a2} = \mu(1-\mu)M$$

where $V_a$, $V_b$, $V_c$, $i_a$, $i_b$, $i_c$ and $e_a$, $e_b$, $e_c$ are the abc phase terminal voltages, currents and back EMF, respectively; R, L and M are the stator phase resistance, self- and mutual-inductances of healthy machine, respectively; $R_{a2}$ and $L_{a2}$ are the resistance and the self-inductance of the faulty winding as2. $M_{a1a2}$, $M_{a2b}$ and $M_{a2c}$ are the mutual inductances between the $a_{s2}$ and the windings $a_{s1}$, $b_s$ and $c_s$, respectively; $I_f$, $r_f$ and $e_f$ are the fault current, fault resistance and fault back-EMF respectively.

The electromagnetic torque generated under ISF can be expressed as:

$$T_e = \frac{e_a i_a + e_b i_b + e_c i_c - e_f i_f}{\omega_m} \quad (3)$$

where $T_e$ is the electromagnetic torque and $\omega_m$ is the rotating speed.

ISF Model in αβ-Coordinates

For the machine having one slot per pole and per phase, $M_{a2b}$ can be considered equal to $M_{a2c}$. By using the Clark transform, (1) can be rewritten as follows:

$$\begin{bmatrix} V_\alpha \\ V_\beta \\ 0 \end{bmatrix} = \begin{bmatrix} R & 0 & -R'_{a2} \\ 0 & R & 0 \\ -R'_{a2} & 0 & R_{a2}+r_f \end{bmatrix} \begin{bmatrix} i_\alpha \\ i_\beta \\ i_f \end{bmatrix} + \begin{bmatrix} e_\alpha \\ e_\beta \\ -e_f \end{bmatrix} + \\ \begin{bmatrix} L' & 0 & -L'_f \\ 0 & L' & 0 \\ -L'_f & 0 & L_{a2} \end{bmatrix} \frac{d}{dt}\begin{bmatrix} i_\alpha \\ i_\beta \\ i_f \end{bmatrix} \quad (4)$$

$$R'_{a2} = \frac{2}{3}R_{a2} \quad (5)$$

$$L' = L - M$$

$$L'_f = \frac{2}{3}(L_{a2} + M_{a1a2} - M_{a2b})$$

Sequence Component Analysis in PMSMs

The positive and negative sequence voltages for PMSM under stator winding inter-turn fault can be expressed as follows:

$$\tilde{V}_{sp} = Z_{pp}\tilde{I}_{sp} + Z_{pn}\tilde{I}_{sn} + Z_{pf}\tilde{I}_f + \tilde{E}_{sp}$$

$$\tilde{V}_{sn} = Z_{nn}\tilde{I}_{sn} + Z_{np}\tilde{I}_{sp} + Z_{nf}\tilde{I}_f + \tilde{E}_{sn} \quad (6)$$

where $\tilde{I}_{sp}$, $\tilde{I}_{sn}$ and $\tilde{I}_f$ are the positive sequence current, the negative sequence current and the current in the fault loop portion, respectively; $\tilde{E}_{sp}$ and $\tilde{E}_{sn}$ are the positive and the negative sequence back EMF, respectively; $Z_{pp}$ and $Z_{nn}$ are positive sequence and negative sequence impedances, respectively; $Z_{pn}$ and $Z_{np}$ are the off-diagonal sequence impedances/cross-sequence impedances, which present the effect of inherent asymmetry; $Z_{pf}$ and $Z_{nf}$ are impedances corresponding to the effect of the fault in the positive and negative sequence models, respectively.

Using the PMSM steady-state model with ISF, the sequence component model for PMSMs can be expressed as:

$$Z_{pp} = Z_{nn} = R + j\omega_e L \quad (7)$$

$$Z_{pf} = Z_{nf} = -\frac{1}{3}\mu Z_{pp}$$

$$\tilde{V}_{sp} = (R + j\omega_e L)\left(\tilde{I}_{sp} - \frac{1}{3}\mu \tilde{I}_f\right) + \tilde{E}_{sp}$$

$$\tilde{V}_{sn} = (R + j\omega_e L)\left(\tilde{I}_{sn} - \frac{1}{3}\mu \tilde{I}_f\right) + \tilde{E}_{sn}$$

$$\mu(\tilde{V}_{sp} + \tilde{V}_{sn}) = \left(\mu j\omega_3 L\left(1 - \frac{2}{3}\mu\right) + \mu R\left(1 - \frac{2}{3}\mu\right) + r_f\right)\tilde{I}_f + \mu(\tilde{E}_{sp} + \tilde{E}_{sn})$$

where $\omega_e$ is the excited electrical frequency.

Let the fault factor $$FF = \tilde{I}_{sp} - \frac{\tilde{V}_{sp}}{Z_{pp}},$$

then we have:

$$FF_h = -\frac{Z_{pn}}{Z_{pp}}\tilde{I}_{sn} - \frac{\tilde{E}_{sp}}{Z_{pp}}; \quad (8)$$

$$FF_f = -\frac{Z_{pn}}{Z_{pp}}\tilde{I}_{sm} - \frac{Z_{pf}}{Z_{pp}}\tilde{I}_f - \frac{\tilde{E}_{sp}}{Z_{pp}}$$

Here, the superscripts h and f indicate the healthy machine and faulty machine, respectively.

Substituting equation (8) into equation (7), the difference between the healthy motor and faulty motor can be presented as equation (9), below.

$$\Delta FF = FF_h - FF_f = -\frac{Z_{pf}}{Z_{pp}}\tilde{I}_f = \frac{1}{3}\mu \tilde{I}_f \quad (9)$$

Therefore, $\Delta FF$ has the fault-dependent value when the fault occurs. Under healthy conditions, $Z_{pn}$ should be zero. Therefore, by tracking the change in $\Delta FF$, the ISF can be detected, even in the case of voltage imbalance and inherent asymmetry of the motor. Additionally, the relation between $\mu$ and $\tilde{I}_f$ can be easily observed by monitoring the fault factor FF. The change in fault factor $\Delta FF$ may be used as an ISF indicator, which may be compared to a fault threshold to determine if the electric machine has ISF. If there is no ISF, $\Delta FF$ will be zero, even with voltage imbalance and inherent asymmetry of the motor. If there is ISF, $\Delta FF$ will not be zero, and the change in fault factor $\Delta FF$ increases as the fault severity increases.

During the incipient fault detection, $\mu$ is small and $r_f$ is large. Furthermore, $\tilde{V}_{sn}$ is negligible compared to $\tilde{V}_{sp}$. Therefore, from equation (7), the relation between $r_f$ and $\mu$ can be calculated as equation (10), below.

$$r_f = \frac{\mu \tilde{V}_{sp}}{\tilde{I}_f} = \frac{\mu^2 \tilde{V}_{sp}}{3\Delta FF} = k\mu^2, \quad (10)$$

where $k = \frac{\tilde{V}_{sp}}{3\Delta FF}$

As long as one of the three parameters ($\tilde{I}_f$, $r_f$ and $\mu$) is estimated, the other two parameters can be easily calculated by using (9) and (10). The estimation process is presented in the next section.

Unscented Kalman Filter for Estimation of Fault Parameters

Unscented Kalman filter (UKF) omits linearization process for computing the covariance and the estimations. The discrete-time nonlinear dynamic system can be represented as $$\begin{cases} x_{k+1} = f(x_k, u_k) + w_k \\ y_k = h(x_k, u_k) + v_k \end{cases} \quad (11)$$

where $x_k$ is the unobserved state of the system; $y_k$ is the observed measurement; $u_k$ is the known exogenous input; $w_k$ and $v_k$ are the zero mean white Gaussian noises with covariance Q and R, respectively; Q and R are the noise covariance of the process and measurement, respectively; and f (,) and h (,) denote the nonlinear function with one-order continuous partial derivative.

The UKF algorithm generally contains four steps (initial values, unscented transform, prediction and correction). Firstly, the mean of the initial state $\tilde{x}$ and the covariance of the initial state $P_x$ are set as (12). After that, the unscented transform is used to pick a set of sigma points around the mean with predefined weights $W_i$. Each sigma point will be processed by f (,) and h (,) for estimated output $\tilde{y}_k$. After $\tilde{y}_k$ is obtained, the output error covariance $P_y$ and cross-covariance $P_{xy}$ can be calculated. Finally, the $\tilde{x}$ and $P_x$ are updated as $\tilde{x}_k'$ and $P_x'$. The details UKF estimation approach is shown as following i. Initial Values $$\tilde{x} = E(x_0); P_x = E[(x_0 - \tilde{x})(x_0 - \tilde{x})^T] \quad (12)$$

where $x_0$ is the initial value of the state.

ii. Unscented Transform $$x_i = \begin{cases} \tilde{x} + \left(\sqrt{(n+\lambda)P_x}\right)_i, & i = 2, \ldots, n+1 \\ \tilde{x} - \left(\sqrt{(n+\lambda)P_x}\right)_{i-n}, & i = n+2, \ldots, 2n+1 \end{cases} \quad (13)$$

$$W_i = \begin{cases} \frac{\lambda}{\lambda + n}, & i = 1 \\ \frac{\lambda}{2(\lambda + n)}, & i = 2, \ldots, 2n+1 \end{cases} \quad (14)$$

where n is the dimension of $\tilde{x}$; $\lambda$ is a design parameter in the UKF algorithm, which is called the scaling parameter.

iii. Prediction $$\tilde{x}_k = \sum_{i=1}^{2n+1} W_i f(x_i) \quad (15)$$

$$\tilde{P}_{x,k} = \sum_{i=1}^{2n+1} W_i (f(x_i) - \tilde{x}_k)(f(x_i) - \tilde{x}_k)^T + Q \quad (16)$$

$$\tilde{y}_k = \sum_{i=1}^{2n+1} W_i h(x_i) \quad (17)$$

iv. Correction $$\tilde{P}_{y,k} = \sum_{i=1}^{2n+1} W_i (h(x_i) - \tilde{y}_k)(h(x_i) - \tilde{y}_k)^T + Q \quad (18)$$

$$\hat{P}_{xy\cdot k} = \sum_{i=1}^{2n+1} W_i(f(x_i) - \hat{x}_k)(h(x_i) - \hat{y}_k)^T + Q \qquad (19)$$

$$K_k = \hat{P}_{xy\cdot k}\hat{P}_{y\cdot k}^{-1} \qquad (20)$$

$$\hat{x}'_k = \hat{x}_k + K_k(\hat{y}_k - h(x_i)) \qquad (21)$$

$$\hat{P}'_x = \hat{P}_{x\cdot k} - K_k\hat{P}_{y\cdot k}K_k^T \qquad (22)$$

To build the state space model for PMSMs with ISF, we define equation (23):

$$\begin{aligned} x_1 &= i_\alpha, \\ x_2 &= \frac{1}{3}\mu i_f, \\ x_3 &= \frac{1}{\mu} \end{aligned} \qquad (23)$$

and the state vector $x=[x_1\ x_2\ x_3]^T$. The state space model for PMSM inter-turn short faults is presented as equation (24), below.

$$x_{k+1} = \begin{bmatrix} i_{\alpha k+1} \\ \frac{1}{3}\mu i_{f,k+1}^i 1 \\ \frac{1}{\mu_{k+1}} \end{bmatrix} = \qquad (24)$$

$$\begin{bmatrix} \frac{-R}{L_{SS}}i_{\alpha\cdot k} - \frac{18}{(9L-4L_{SS})}\left(\frac{1}{3}\mu i_{f,k}\right)\left(\frac{1}{\mu_k}\right) + \frac{18L_{SS}R - 3L_{ss}k_f}{(9L-4L_{SS})}\left(\frac{1}{3}\mu i_{f,k}\right) - \\ \frac{9L(u_{\alpha\cdot k} - e_{\alpha\cdot k})}{(4L_{SS}^2 - 9LL_{SS})} + \frac{6e_{\alpha\cdot k}}{(9L-4L_{SS})}\left(\frac{1}{\mu_k}\right) \\ \frac{-3R}{(9L-4L_{SS})} + \frac{4R-9k_f}{(9L-4L_{SS})}\left(\frac{1}{3}\mu i_{f,k}\right)\left(\frac{1}{\mu_k}\right)\frac{6(u_{\alpha\cdot k} - e_{\alpha\cdot k})}{(9L-4L_{SS})}\left(\frac{1}{\mu_k}\right) + \\ \frac{9e_{\alpha\cdot k}}{(9L-4L_{SS})}\left(\frac{1}{\mu_k}\right) \\ 0 \end{bmatrix}$$

Torque Ripple Compensation Under ISF

Assuming the $i_f = I_f\cos(\omega_e t + \varphi)$, where $I_f$ is the amplitude of $i_f$, $\omega_e$ is the electrical angular velocity of the rotor, $\varphi$ is the initial phase angle for short circuit current. The electromagnetic torque generated under ISF in the dq-axis can be expressed as equation (25), below.

$$T_e = \frac{3N_p}{2}\varphi_m i_q + N_p\mu I_f\varphi_m\sin\varphi - N_p\mu I_f\varphi_m\sin(2\omega_e t + \varphi) \qquad (25)$$

where $\varphi_m$ is the permanent magnet flux linkage. It can be seen from equation (25) that there are second order harmonic in the torque equation when the fault current is not zero, which will cause torque ripples.

To eliminate the torque ripples caused by ISF, the fault current $\mu i_f$ estimated from UKF will be added to phase A current. With the current compensation, the torque equation in (2) will be updated as equation (26), below.

$$T_e = \frac{e_a(i_a + \mu i_f) + e_b i_b + e_c i_c - \mu e_a i_f}{\omega_m} = T_e = \frac{e_a i_a + e_b i_b + e_c i_c}{\omega_m} \qquad (26)$$

It can be seen from equation (26), there is no more faulty term in the torque equation after compensation. By using Park transformation $T_{abc\_dq}$, the compensation current in the dq-axis can be expressed as equation (27), below.

$$\begin{cases} i_d^{com} = \frac{2}{3}\mu i_f\sin\theta_e \\ i_q^{com} = \frac{2}{3}\mu i_f\cos\theta_e \end{cases} \qquad (27)$$

where $\theta_e$ the electrical angle of the rotor.

Matrices of transformations, $T_{abc\_\alpha\beta}$, $T_{abc\_dq}$, and $T_{dq\_abc}$, used in the transform blocks 222, 218, 206 are defined as equations (28), (29), and (30), respectively, below:

$$T_{abc\_\alpha\beta} = \frac{2}{3}\begin{bmatrix} 1 & -\frac{1}{2} & -\frac{1}{2} \\ 0 & \frac{\sqrt{3}}{2} & -\frac{\sqrt{3}}{2} \\ \frac{1}{2} & \frac{1}{2} & \frac{1}{2} \end{bmatrix} \qquad (28)$$

$$T_{abc\_dq} = \frac{2}{3}\begin{bmatrix} \sin(\theta_e) & \sin\left(\theta_e - \frac{2\pi}{3}\right) & \sin\left(\theta_e + \frac{2\pi}{3}\right) \\ \cos(\theta_e) & \cos\left(\theta_e - \frac{2\pi}{3}\right) & \cos\left(\theta_e + \frac{2\pi}{3}\right) \end{bmatrix} \qquad (29)$$

$$T_{dq\_abc} = \frac{2}{3}\begin{bmatrix} \sin(\theta_e) & \cos(\theta_e) & 1 \\ \sin\left(\theta_e - \frac{2\pi}{3}\right) & \cos\left(\theta_e - \frac{2\pi}{3}\right) & 1 \end{bmatrix} \qquad (30)$$

Validation in FEA-Based System Simulation

Figure 5:
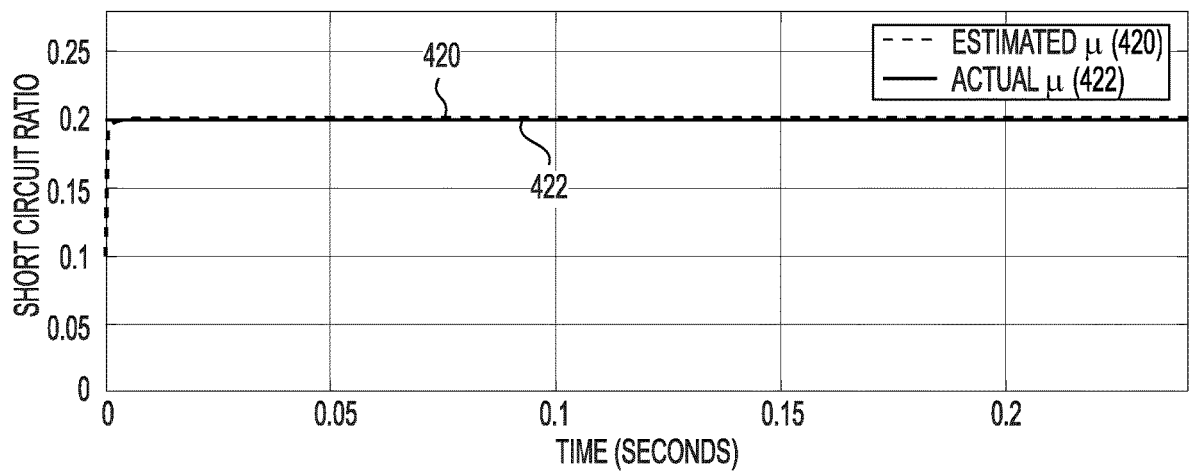
FIG. 5 is a graph showing estimated and actual ratios of short circuit turns in accordance with aspects of the present disclosure.
Figure 6:
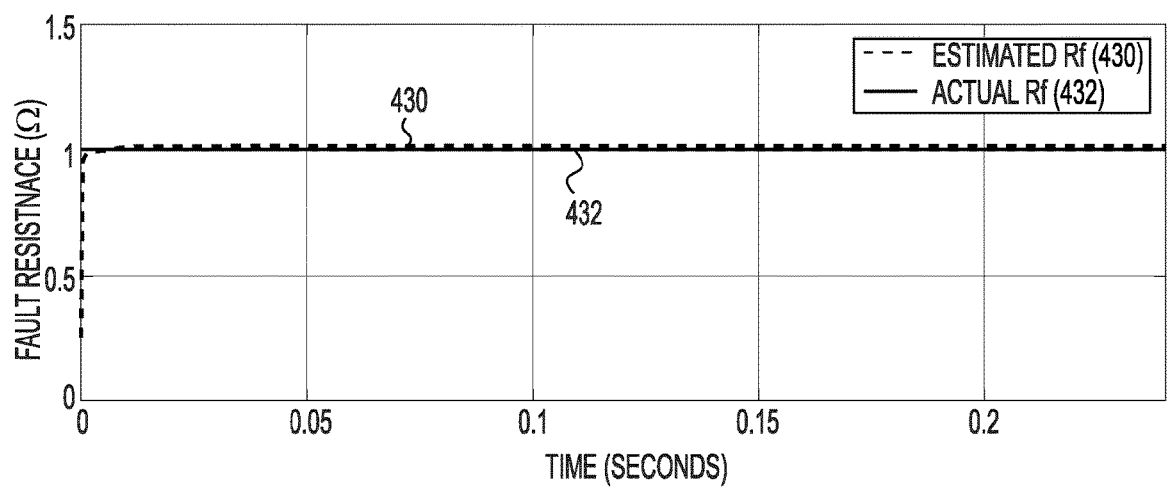
FIG. 6 is a graph showing estimated and actual fault resistances in accordance with aspects of the present disclosure.
Figure 7:
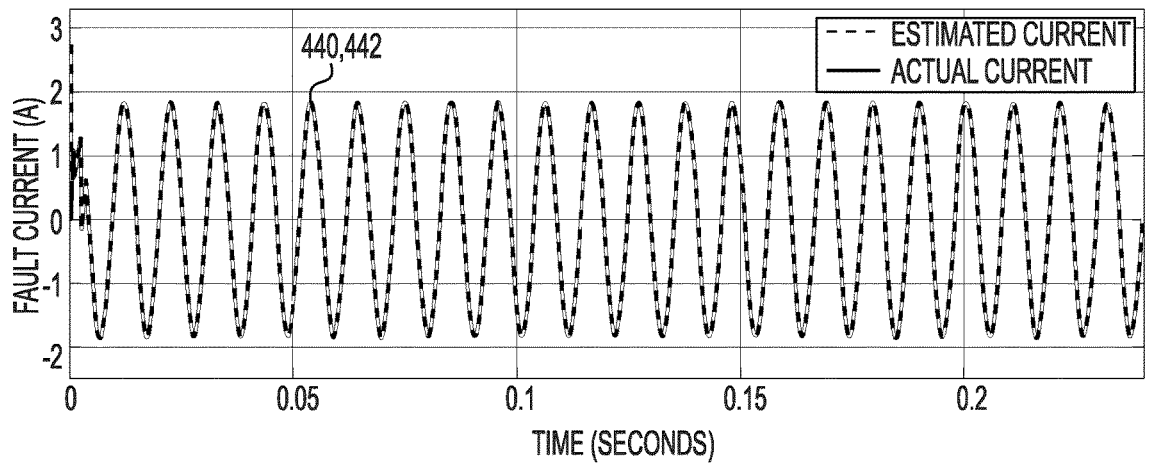
FIG. 7 is a graph showing estimated and actual fault currents in accordance with aspects of the present disclosure.

Simulation results are shown FIGS. 5-7, in which FIG. 5 is a graph a showing comparison between estimated and actual ratios of short circuit turns to total turns (μ) in a faulted winding. Specifically, FIG. 3 includes a first plot 420 of estimated μ, which is estimated using a method of the present disclosure. FIG. 5 also includes a second plot 422 of actual μ. FIG. 6 is a graph showing estimated and actual fault resistances ($r_f$) in a faulted winding. Specifically, FIG. 6 includes a third plot 430 of estimated fault resistance $r_f$, which is estimated using a method of the present disclosure. FIG. 6 also includes a fourth plot 432 of actual fault resistance $r_f$. FIG. 7 is a graph showing a comparison between estimated and actual fault currents ($I_f$) in a faulted winding. Specifically, FIG. 7 includes a fifth plot 440 of estimated fault current $I_f$, which is estimated using a method of the present disclosure. FIG. 7 also includes a sixth plot 442 of actual fault current $I_f$.

Figure 8:
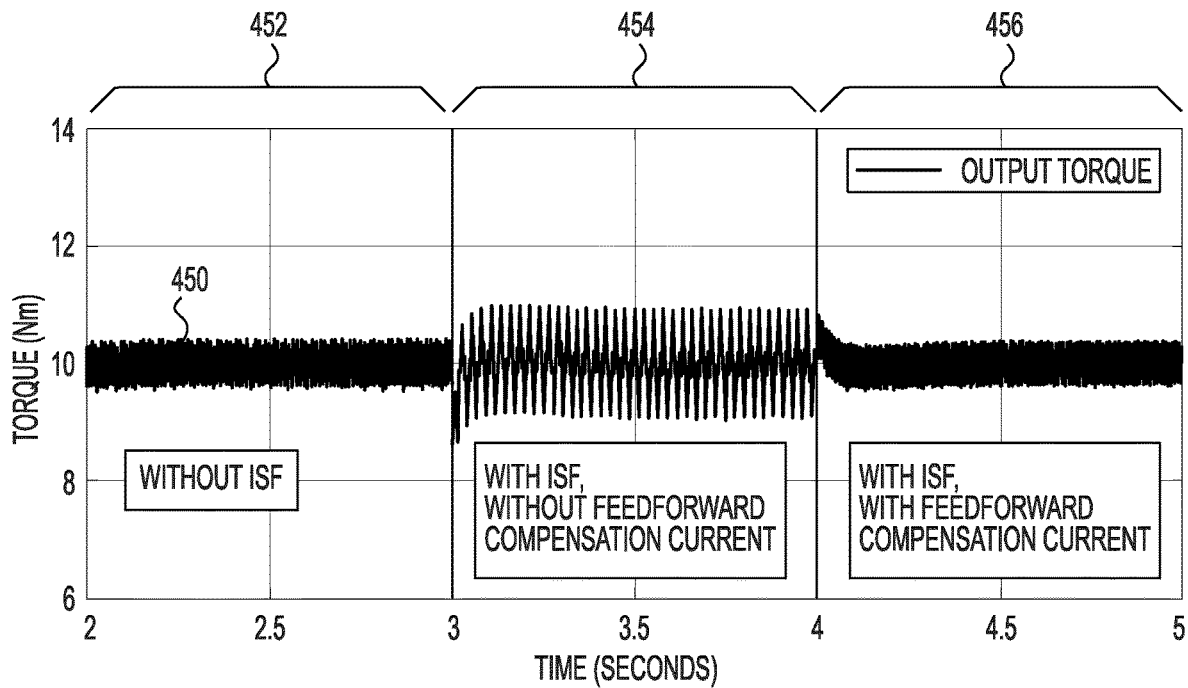
FIG. 8 is a graph showing PMSM output torque under three different working conditions: without ISF (Time=2-3 s); with ISF but without feedforward compensation current (Time=3-4 s); with ISF and with feedforward compensation current (Time=4-5 s) in accordance with aspects of the present disclosure.

FIG. 8 includes a seventh plot 450 of output torque of the PMSM 26 under three different working conditions. A first condition 452, without ISF, extends from time=2-3 s. A second condition 454, with ISF but without feedforward compensation current, extends from time=3-4 s. A second condition 456, with ISF and with feedforward compensation current, extends from time=4-5 s.

Figure 9:
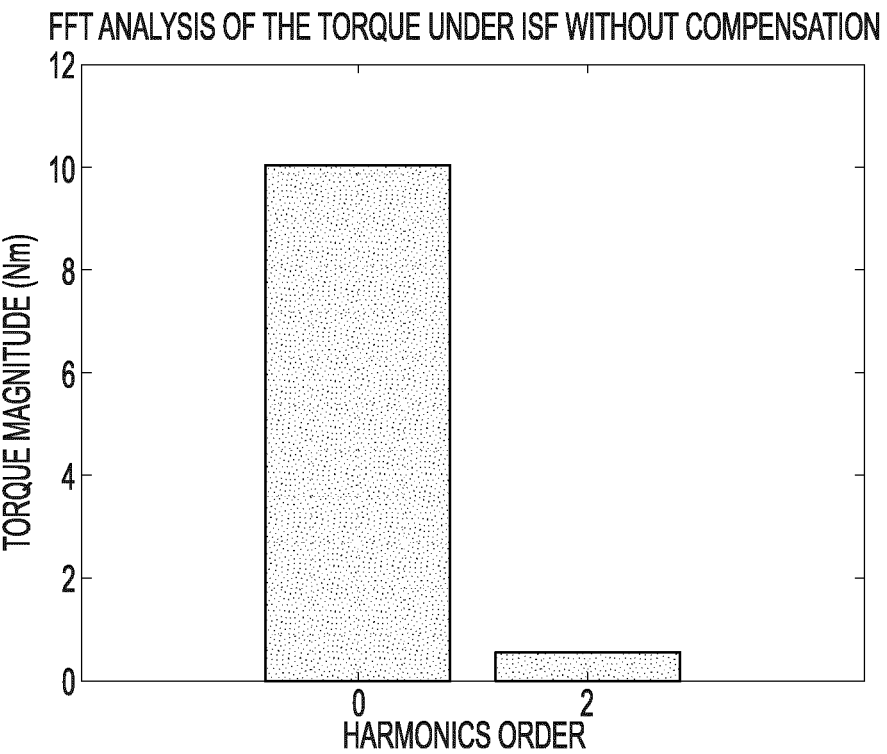
FIG. 9 is a bar chart listing Fast Fourier transform (FFT) analysis results for PMSM output torque under ISF without compensation current, in accordance with aspects of the present disclosure.
Figure 10:
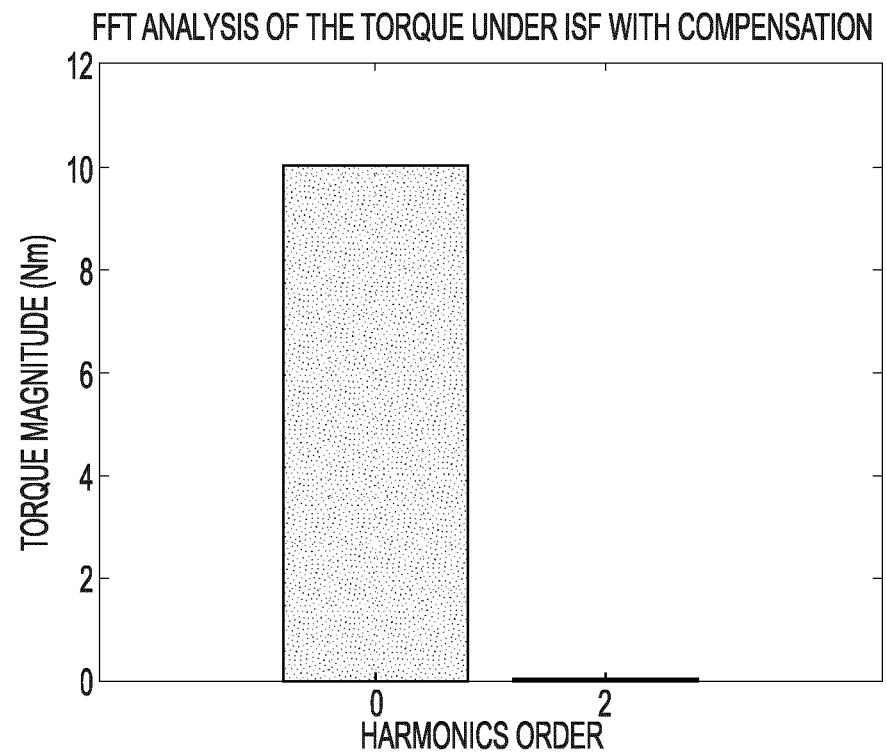
FIG. 10 is a bar chart listing Fast Fourier transform (FFT) analysis results for PMSM output torque under ISF with compensation current, in accordance with aspects of the present disclosure.

FIG. 9 shows a bar chart listing Fast Fourier transform (FFT) analysis results for PMSM output torque under ISF without compensation current. The bar chart of FIG. 9 shows Torque at a magnitude of about 10 Nm for 0th order harmonic, and about 0.5 Nm for $2^{nd}$ order harmonic. FIG. 10 is a bar chart listing Fast Fourier transform (FFT) analysis results for PMSM output torque under ISF with compensation current. The bar chart of FIG. 10 shows Torque at a magnitude of about 10 Nm for 0th order harmonic, and about 0.05 Nm for $2^{nd}$ order harmonic.

According to an aspect of the disclosure, three-phase voltage and current are measured to calculate the sequence components of an electric machine. If the ISF indicator composed by the sequence components reaches the fault threshold, the relationship between the percentage of shorted turns and fault loop resistance will be derived by comparing the sequence components with the healthy motor and the UKF will be used to estimate the fault parameters, including the fault current, the percentage of shorted turns and fault loop resistance in a faulted winding of the electric machine.

According to an aspect of the disclosure, a relationship between the percentage of shorted turns and fault loop resistance is derived by analyzing the sequence components of an electric machine, such as a PMSM. The unscented Kalman filter (UKF) is then employed to estimate the fault current, the percentage of shorted turns and fault loop resistance in a faulted winding of the electric machine. The effect of voltage imbalance and inherent asymmetry are considered and canceled out in the proposed method during the fault severity estimation. During the whole estimation process, no complicated AI-based algorithm is involved.

According to an aspect of the disclosure, the compensation current for an inter-turn short circuit fault is estimated from unscented Kalman filter (UKF) to eliminate the torque ripples caused by inter-turn short circuit fault.

According to an aspect of the disclosure, a relationship between the percentage of shorted turns and fault loop resistance is derived by analyzing the sequence components of an electric machine, such as a PMSM. The unscented Kalman filter (UKF) is then employed to estimate the fault current, the percentage of shorted turns and fault loop resistance in a faulted winding of the electric machine. The effect of voltage imbalance and inherent asymmetry are considered and canceled out in the proposed method during the fault severity estimation. During the whole estimation process, no complicated AI-based algorithm is involved.

A method for characterizing an inter-turn short circuit fault in a winding of an electric machine is provided. The method includes: determining phase voltages and phase currents of the electric machine; calculating sequence components of the electric machine based on the phase voltages and the phase currents; determining, based on the sequence components of the electric machine, a ratio between a percentage of shorted turns in the winding and a fault loop resistance; and estimating, using an unscented Kalman filter, at least one characteristic of the inter-turn short circuit fault, the at least one characteristic including at least one of: a fault current, the percentage of shorted turns, and the fault loop resistance.

In some embodiments, the at least one characteristic of the inter-turn short circuit fault includes the fault current, the percentage of shorted turns, and the fault loop resistance.

In some embodiments, the electric machine is a permanent magnet synchronous machine.

A method for compensating an inter-turn short circuit fault in an electric machine comprises: determining a plurality of phase voltages based on a current command; applying, by an inverter, the plurality of phase voltages to corresponding windings of a plurality of windings of the electric machine, one of the windings having the inter-turn short circuit fault; determining phase currents in each of the plurality of windings; calculating sequence components of the electric machine based on the plurality of phase voltages and the phase currents; determining a change in fault factor based on the sequence components; determining if the change in fault factor is greater than a fault threshold value; estimating, in response to determining the change in fault factor is greater than the fault threshold value, using an unscented Kalman filter, at least one characteristic of the inter-turn short circuit fault, the at least one characteristic including a fault current in the inter-turn short circuit fault; and determining a compensation current based on the fault current in the inter-turn short circuit fault; and adjusting the current command based on the compensation current to compensate the fault current.

In some embodiments, the at least one characteristic of the inter-turn short circuit fault further includes a fault resistance.

In some embodiments, the at least one characteristic of the inter-turn short circuit fault further includes a ratio of shorted turns to total turns in the one of the windings having the inter-turn short circuit fault.

In some embodiments, determining the compensation current based on the fault current in the inter-turn short circuit fault further includes calculating the compensation current based on a ratio of shorted turns to total turns in the one of the windings having the inter-turn short circuit fault.

In some embodiments, the method further includes: determining an absolute value of the fault current; and determining if the absolute value of the fault current is less than a failure threshold; and wherein adjusting the current command based on the compensation current to compensate the fault current is performed only if the absolute value of the fault current is less than the failure threshold.

In some embodiments, the method further includes: determining an absolute value of the fault current; determining if the absolute value of the fault current is greater than a failure threshold; and flagging the electric machine as being faulty in response to determining the absolute value of the fault current is greater than the failure threshold.

In some embodiments, the method further includes: stopping the electric machine in response to determining the absolute value of the fault current is greater than the failure threshold.

In some embodiments, determining the change in fault factor based on the sequence components includes computing a fault factor (FF) as $$FF = \tilde{I}_{sp} - \frac{\tilde{V}_{sp}}{Z_{pp}},$$

where $\tilde{I}_{sp}$ is a positive sequence current, $\tilde{V}_{sp}$ is a positive sequence voltage and $Z_{pp}$ is a positive sequence impedance.

In some embodiments, the electric machine is a permanent magnet synchronous machine.

A system for compensating an inter-turn short circuit fault in an electric machine having a plurality of windings is provided. The system comprises: an inverter configured to apply phase voltages to corresponding windings of the plurality of windings, one of the plurality of windings having the inter-turn short circuit fault; and a controller. The controller is configured to: determine the phase voltages based on a current command; determine phase currents in each of the plurality of windings; calculate sequence components of the electric machine based on the phase voltages and the phase currents; calculate a change in fault factor based on the sequence components; determine if the change in fault factor is greater than a fault threshold value; estimate, in response to determining the change in fault factor is greater than the fault threshold value, using an unscented Kalman filter, at least one characteristic of the inter-turn short circuit fault, the at least one characteristic including a fault current in the inter-turn short circuit fault; determine a compensation current based on the fault current in the inter-turn short circuit fault; and adjust the current command based on the compensation current to compensate the fault current.

In some embodiments, the at least one characteristic of the inter-turn short circuit fault further includes a fault resistance and a ratio of shorted turns to total turns in the one of the plurality of windings having the inter-turn short circuit fault.

In some embodiments, determining the compensation current based on the fault current in the inter-turn short circuit fault further includes calculating the compensation current based on a ratio of shorted turns to total turns in the one of the windings having the inter-turn short circuit fault.

The controller and its related methods and/or processes described above, and steps thereof, may be realized in hardware, software or any combination of hardware and software suitable for a particular application. The hardware may include a general purpose computer and/or dedicated computing device or specific computing device or particular aspect or component of a specific computing device. The processes may be realized in one or more microprocessors, microcontrollers, embedded microcontrollers, programmable digital signal processors or other programmable device, along with internal and/or external memory. The processes may also, or alternatively, be embodied in an application specific integrated circuit, a programmable gate array, programmable array logic, or any other device or combination of devices that may be configured to process electronic signals. It will further be appreciated that one or more of the processes may be realized as a computer executable code capable of being executed on a machine readable medium.

The computer executable code may be created using a structured programming language such as C, an object oriented programming language such as C++, or any other high-level or low-level programming language (including assembly languages, hardware description languages, and database programming languages and technologies) that may be stored, compiled or interpreted to run on one of the above devices as well as heterogeneous combinations of processor architectures, or combinations of different hardware and software, or any other machine capable of executing program instructions.

Thus, in one aspect, each method described above and combinations thereof may be embodied in computer executable code that, when executing on one or more computing devices performs the steps thereof. In another aspect, the methods may be embodied in systems that perform the steps thereof, and may be distributed across devices in a number of ways, or all of the functionality may be integrated into a dedicated, standalone device or other hardware. In another aspect, the means for performing the steps associated with the processes described above may include any of the hardware and/or software described above. All such permutations and combinations are intended to fall within the scope of the present disclosure.

The foregoing description is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A method for characterizing an inter-turn short circuit fault in a winding of an electric machine, comprising:
    determining phase voltages and phase currents of the electric machine;
    calculating sequence components of the electric machine based on the phase voltages and the phase currents;
    determining, based on the sequence components of the electric machine, a ratio between a percentage of shorted turns in the winding and a fault loop resistance; and
    estimating, using an unscented Kalman filter, at least one characteristic of the inter-turn short circuit fault, the at least one characteristic including at least one of: a fault current in the inter-turn short circuit fault, the percentage of shorted turns, and the fault loop resistance.

2. The method of claim 1, wherein the at least one characteristic of the inter-turn short circuit fault includes the fault current, the percentage of shorted turns, and the fault loop resistance.

3. The method of claim 1, wherein the electric machine is a permanent magnet synchronous machine.

4. A method for compensating an inter-turn short circuit fault in an electric machine, the method comprising:
    determining a plurality of phase voltages based on a current command;
    applying, by an inverter, the plurality of phase voltages to corresponding windings of a plurality of windings of the electric machine, one of the windings having the inter-turn short circuit fault;
    determining phase currents in each of the plurality of windings;
    calculating sequence components of the electric machine based on the plurality of phase voltages and the phase currents;
    determining a change in fault factor based on the sequence components;
    determining if the change in fault factor is greater than a fault threshold value;
    estimating, in response to determining the change in fault factor is greater than the fault threshold value, using an unscented Kalman filter, at least one characteristic of the inter-turn short circuit fault, the at least one characteristic including a fault current in the inter-turn short circuit fault;
    determining a compensation current based on the fault current in the inter-turn short circuit fault; and
    adjusting the current command based on the compensation current to compensate the fault current.

5. The method of claim 4, wherein the at least one characteristic of the inter-turn short circuit fault further includes a fault resistance.

6. The method of claim 4, wherein the at least one characteristic of the inter-turn short circuit fault further includes a ratio of shorted turns to total turns in the one of the windings having the inter-turn short circuit fault.

7. The method of claim 4, wherein determining the compensation current based on the fault current in the inter-turn short circuit fault further includes calculating the compensation current based on a ratio of shorted turns to total turns in the one of the windings having the inter-turn short circuit fault.

8. The method of claim 4, further comprising:
determining an absolute value of the fault current;
determining if the absolute value of the fault current is less than a failure threshold; and
wherein adjusting the current command based on the compensation current to compensate the fault current is performed only if the absolute value of the fault current is less than the failure threshold.

9. The method of claim 8, further comprising: stopping the electric machine in response to determining the absolute value of the fault current is greater than the failure threshold.

10. The method of claim 4, further comprising:
determining an absolute value of the fault current;
determining if the absolute value of the fault current is greater than a failure threshold; and
flagging the electric machine as being faulty in response to determining the absolute value of the fault current is greater than the failure threshold.

11. The method of claim 4, wherein determining the change in fault factor based on the sequence components includes computing a fault factor (FF) as $FF=\tilde{I}\_sp-\tilde{V}\_sp/Z\_pp$, where $\tilde{I}\_sp$ is a positive sequence current, $\tilde{V}\_sp$ is a positive sequence voltage and $Z\_pp$ is a positive sequence impedance.

12. The method of claim 4, wherein the electric machine is a permanent magnet synchronous machine.

13. A system for compensating an inter-turn short circuit fault in an electric machine having a plurality of windings, comprising:
an inverter configured to apply phase voltages to corresponding windings of the plurality of windings, one of the plurality of windings having the inter-turn short circuit fault; and
a controller configured to:
determine the phase voltages based on a current command;
determine phase currents in each of the plurality of windings;
calculate sequence components of the electric machine based on the phase voltages and the phase currents;
calculate a change in fault factor based on the sequence components;
determine if the change in fault factor is greater than a fault threshold value;
estimate, in response to determining the change in fault factor is greater than the fault threshold value, using an unscented Kalman filter, at least one characteristic of the inter-turn short circuit fault, the at least one characteristic including a fault current in the inter-turn short circuit fault;
determine a compensation current based on the fault current in the inter-turn short circuit fault; and
adjust the current command based on the compensation current to compensate the fault current.

14. The system of claim 13, wherein the at least one characteristic of the inter-turn short circuit fault further includes a fault resistance and a ratio of shorted turns to total turns in the one of the plurality of windings having the inter-turn short circuit fault.

15. The system of claim 13, wherein determining the compensation current based on the fault current in the inter-turn short circuit fault further includes calculating the compensation current based on a ratio of shorted turns to total turns in the one of the windings having the inter-turn short circuit fault.

16. The system of claim 13, wherein the controller is further configured to:
determine an absolute value of the fault current; and
determine if the absolute value of the fault current is less than a failure threshold; and
wherein adjusting the current command based on the compensation current to compensate the fault current is performed only if the absolute value of the fault current is less than the failure threshold.

17. The system of claim 13, wherein the controller is further configured to:
determine an absolute value of the fault current;
determine if the absolute value of the fault current is greater than a failure threshold; and
flag the electric machine as being faulty in response to determining the absolute value of the fault current is greater than the failure threshold.

18. The system of claim 17, wherein the controller is further configured to stop the electric machine in response to determining the absolute value of the fault current is greater than the failure threshold.

19. The system of claim 13, wherein calculating the change in fault factor based on the sequence components includes the controller computing a fault factor (FF) as $FF=\tilde{I}\_sp-\tilde{V}\_sp/Z\_pp$, where $\tilde{I}\_sp$ is a positive sequence current, $\tilde{V}\_sp$ is a positive sequence voltage and $Z\_pp$ is a positive sequence impedance.

20. The system of claim 13, wherein the electric machine is a permanent magnet synchronous machine.

* * * * *